United States Patent
Kitayama

(10) Patent No.: US 7,311,738 B2
(45) Date of Patent: Dec. 25, 2007

(54) POSITIONING APPARATUS

(75) Inventor: Fumiaki Kitayama, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 189 days.

(21) Appl. No.: 10/947,284

(22) Filed: Sep. 23, 2004

(65) Prior Publication Data

US 2005/0095116 A1    May 5, 2005

(30) Foreign Application Priority Data

Sep. 26, 2003   (JP)   ............... 2003-335641

(51) Int. Cl.
*H01L 21/00*   (2006.01)
*H01L 21/64*   (2006.01)

(52) U.S. Cl. ............ 29/25.01; 438/7; 438/16; 257/E21.521; 256/614; 256/620

(58) Field of Classification Search ............ 438/7, 438/16; 257/E21.521; 356/614, 620
See application file for complete search history.

(56) References Cited

U.S. PATENT DOCUMENTS

| | | | |
|---|---|---|---|
| 6,188,467 B1 | 2/2001 | Yamatsu et al. | 355/72 |
| 6,819,425 B2 * | 11/2004 | Kwan | 356/399 |
| 2001/0016293 A1 * | 8/2001 | Nishi et al. | 430/22 |
| 2004/0032575 A1 * | 2/2004 | Nishi et al. | 355/53 |
| 2004/0101984 A1 * | 5/2004 | Heine et al. | 438/16 |
| 2004/0191652 A1 * | 9/2004 | Dishon et al. | 430/30 |

FOREIGN PATENT DOCUMENTS

JP    11-016806    1/1999

* cited by examiner

*Primary Examiner*—George R. Fourson
*Assistant Examiner*—John M. Parker
(74) *Attorney, Agent, or Firm*—Fitzpatrick, Cella, Harper & Scinto

(57) ABSTRACT

A positioning apparatus for positioning a substrate. The positioning apparatus includes a setting system which selectively sets one of a center of the substrate and a specific portion of an edge of the substrate as a positioning reference in accordance with information inputted to the positioning apparatus, and a positioning system which positions the substrate based on a position of the positioning reference set by the setting system.

14 Claims, 8 Drawing Sheets

FLOW OF SEMICONDUCTOR DEVICE MANUFACTURE

POSITIONING APPARATUS

FIELD OF THE INVENTION

The present invention relates to a positioning technique for positioning a substrate.

BACKGROUND OF THE INVENTION

A semiconductor manufacturing apparatus aligns a substrate prior to processing the substrate (e.g., exposure and injection). As one process for alignment, there is a process called prealignment (coarse alignment). This process is performed to coarsely align (prealign) the substrate so that the positional deviation of the substrate placed on a substrate processing stage falls within a predetermined range before processing the substrate on the substrate processing stage.

For example, in a semiconductor exposure apparatus, the prealignment process can be performed for the purpose of aligning the substrate which is never used in a lithography process (exposure) to determine the position of a pattern to be formed (an underlying pattern used in the next exposure), and prealigning to feed the substrate, which has been used in the lithography process once or more and has a mark for measuring the position of the substrate, to a field of view of a measurement device (e.g., an image processing device) for aligning the substrate at a high precision required in the exposure process.

For example, the following methods are employed in the prealignment process.

(a) A method of aligning the substrate by pushing a plurality of pins against the edge of the substrate (peripheral portion of the substrate) placed on as substrate holder.

(b) A method of, by using a substrate moving mechanism for holding and moving the substrate in a plane direction and a rotational direction, and a measurement device for measuring the position of the edge of the substrate using a linear image sensor, and the like, obtaining the position of the edge of the substrate on the basis of the output result of the measurement device, and moving the substrate by the substrate moving mechanism so that the edge of the substrate is at a predetermined position.

(c) A method of, by using the substrate moving mechanism for holding and moving the substrate in the plane direction and the rotational direction, and the measurement device for measuring the position of the edge of the substrate using the linear image sensor, and the like, calculating the position of the edge of the substrate by the measurement device while rotating the substrate by the substrate moving mechanism, and obtaining the central position and the size of the substrate on the basis of the calculation result, thereby moving the substrate by the substrate moving mechanism on the basis of these pieces of information.

However, an alignment reference for aligning the substrate in the above methods (a) and (b) is different from that in the method (c). That is, in the above methods (a) and (b), the edge of the substrate is aligned to the predetermined position. However, in the method (c), the center of the substrate is aligned to the predetermined position.

Between the substrates respectively aligned by the prealignment apparatus with the different alignment references, the positions of the prealigned substrates placed on the processing stage can be different from each other. If these substrate processing apparatuses with the different alignment references process the same substrate, various problems arise.

Assume that a substrate processing apparatus A incorporates a prealignment apparatus which employs the method (a), and a substrate processing apparatus B incorporates a prealignment apparatus which employs the method (c). The substrate processing apparatus A transfers (exposes) a pattern onto the substrate which is never exposed, and the substrate processing apparatus B processes the substrate in the next process. In this case, the position of a mark on the substrate is different from that expected in the substrate processing apparatus B because the alignment reference of the apparatus A is different from that of the apparatus B.

Therefore, when the substrate processing apparatus B measures the mark position for alignment at a high precision by image processing, and the like, the mark on the substrate may fall outside the measurement field of view. That is, between the apparatuses with the prealignment mechanisms respectively with the different alignment references, a so-called "mix and match" process cannot be implemented, thus posing a problem.

As a measure against this problem, the following methods are considered.

(1) When the mark falls outside the measurement field of view in measuring the mark position for fine alignment (high-precision alignment), the alignment is manually assisted.

(2) Even when the substrate processed by the apparatuses with the different prealignment references is to be processed, the measurement field of view of the measurement device for the fine alignment is enlarged to allow detection of the measurement mark.

(3) When the mark is not observed in the field of view of the measurement device in measuring the mark on the substrate by the measurement device for the fine alignment, the mark is searched (Japanese Patent Laid-Open No. 11-16806).

However, in the methods (1) and (3), the processes require manual assist and search, thereby decreasing the substrate processing throughput of the device per unit time.

In the method (2), the mechanism becomes complicated, the cost of the device increases and the subject processing throughput decreases. More specifically, as a pattern has been further micropatterned recently, a high-precision substrate position detection needed for the measurement device for fine alignment is also required. As a method of implementing a high-precision (i.e., high-resolution) measurement device with a large field of view, for example, there is available a method of measuring the mark position by switching magnifications using a mechanism for switching measurement magnifications. However, in such a method, the mechanism becomes complicated, the cost of the apparatus increases, and the substrate processing throughput per unit time decreases because the low-magnification measurement process, which is not required in the conventional method, is added.

SUMMARY OF THE INVENTION

The present invention has been made in consideration of the above problems, and has as its object to solve the problem of positioning failure caused by the difference between the positioning references.

A positioning apparatus of the present invention is directed to a positioning apparatus for positioning a substrate, and is characterized by comprising a setting system, which sets a positioning reference as a portion of the substrate, and a position system, which positions the substrate based on a position of the positioning reference set by the setting system.

In a preferred embodiment of the present invention, preferably, the setting system selectively sets one of a center of the substrate and an edge of the substrate as the positioning reference.

In the preferred embodiment of the present invention, preferably, the positioning system includes a measurement system which measures a position of the edge of the substrate, and positions the substrate one the basis of an output from the measurement system.

In the preferred embodiment of the present invention, preferably, the positioning system includes a plurality of measurement systems each of which measures a position of an edge of the substrate, and selects at least a part of the plurality of the measurement systems to be used based on the positioning reference.

In the present invention, a substrate processing apparatus is characterized by comprising a substrate stage, which holds the substrate, and the positioning apparatus adapted to a prealignment system which cooperates with the substrate stage to prealign the substrate.

In the preferred embodiment of the present invention, preferably, the substrate processing apparatuses comprises a mark detecting system which detects a position of a mark on the substrate held by the substrate stage.

In the preferred embodiment of the present invention, preferably, the substrate processing apparatus can comprise an exposure system which exposes the substrate held by the substrate stage to a pattern.

In the preferred embodiment of the present invention, preferably, the prealignment system changes a position of the substrate on the substrate stage based on the positioning reference.

In the preferred embodiment of the present invention, preferably, the prealignment system positions the substrate stage holding the substrate, based on the positioning reference.

The device manufacturing method of the present invention is characterized by comprising steps of positioning a substrate using the positioning apparatus as mentioned above and processing the positioned substrate. In the device manufacturing method, for example, the device is manufactured in the lithography process. The lithography process may include a step of transferring a pattern to a photosensitive agent on the substrate by the above substrate processing apparatus serving as an exposure device, and a step of developing the photosensitive agent to which the pattern has been transferred.

For example, the present invention can solve the problem of alignment failure caused by the difference between the alignment references.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention will be described with reference to the accompanying drawings.

Figure 1:
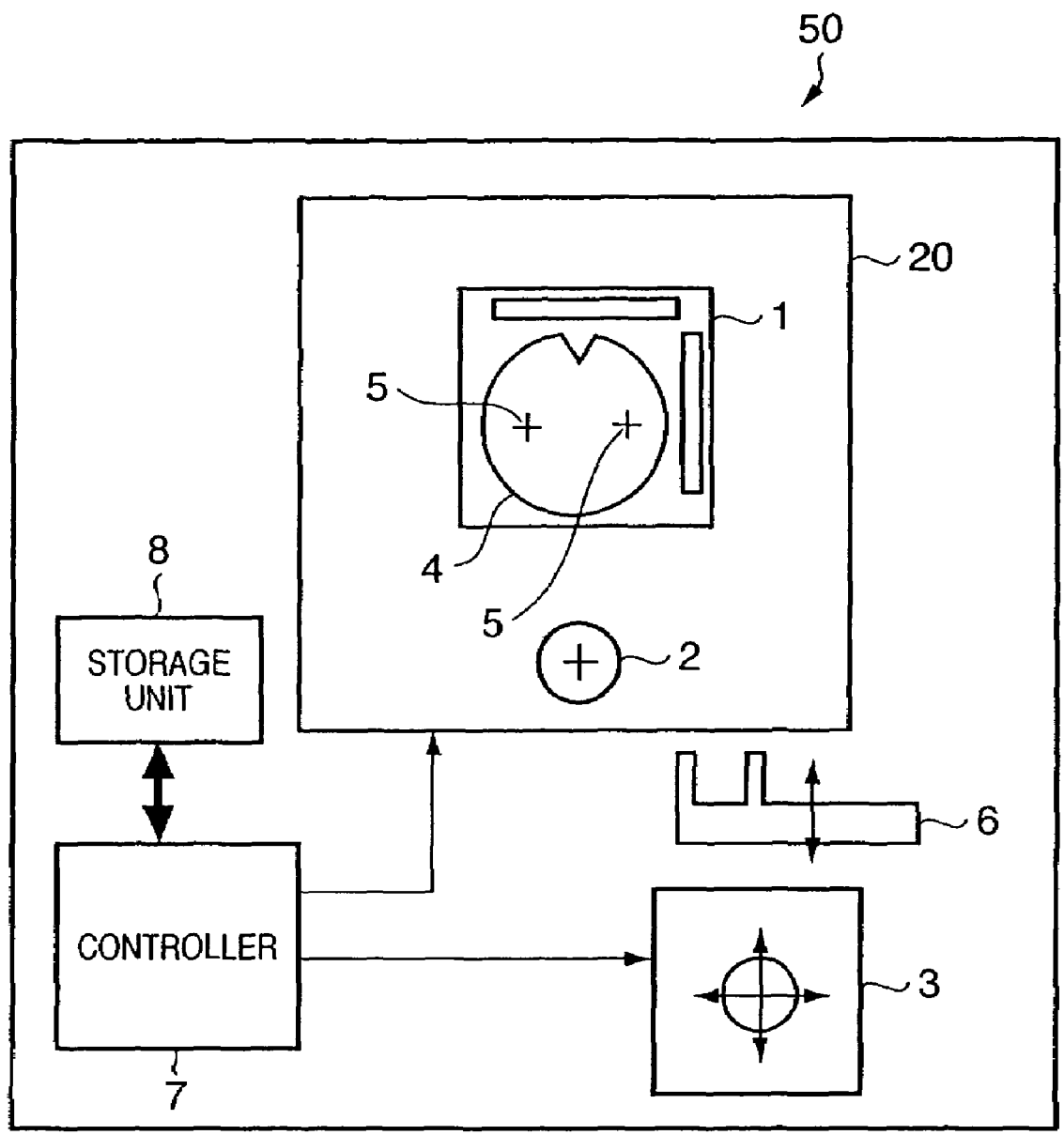
FIG. 1 is a view showing a schematic arrangement of a substrate processing apparatus according to a preferred embodiment of the present invention.

FIG. 1 is a view showing the schematic arrangement of a substrate processing apparatus according to a preferred embodiment of the present invention. A substrate processing apparatus 50 includes an exposure unit 20 for transferring a master pattern to a substrate coated with a photosensitive agent, and serves as an exposure device. The exposure unit 20 has a substrate processing stage (e.g., a six-axis driving stage) 1 on which the substrate to be processed is placed, and a mark detector 2 for precisely detecting the position of a measurement mark (a measurement pattern) formed on the substrate. The mark detector 2 can include a microscope of an off-axis scheme, TTL (Through The Lens) scheme, or TTR (Through The Reticle) scheme. At least one measurement mark 5 is formed on a substrate 4 to be processed. The measurement mark 5 can be formed simultaneously with an underlying pattern in a lithography process.

The substrate processing apparatus 50 has a prealignment apparatus (alignment apparatus) 3. Note that the prealignment apparatus 3 may be arranged outside the substrate processing apparatus 50. The prealignment apparatus 3 roughly aligns or prealigns the substrate prior to measuring the mark by the mark detector 2 (one step of high-precision alignment). That is, when detecting and aligning the mark position, the alignment precision of the prealignment apparatus 3 is lower than that of the alignment system including the mark detector 2.

The substrate 4, which is roughly aligned by the prealignment apparatus 3, is transported to the substrate processing stage 1 by a substrate transport mechanism 6.

The substrate processing apparatus 50 is controlled by a controller 7. For example, the controller 7 controls the exposure unit 20, prealignment apparatus 3, and transport mechanism 6, in accordance with a preset control sequence or a control sequence supplied from an external unit, as needed, thereby transferring the master pattern to an optimal position on the photosensitive agent applied to the substrate transported from the external unit.

A storage unit (setting unit) 8 holds information pertaining to the alignment reference in a prealignment process performed by the prealignment apparatus 3 (this information will be referred to as reference information hereinafter), and can supply the reference information to the controller 7. In this embodiment, the alignment reference in the prealignment process performed by the prealignment apparatus 3 is set by storing the reference information in the storage unit 8. For example, this alignment reference can be set as the center of the substrate, or a predetermined portion on the edge of the substrate (typically, a notch).

The operation of the substrate processing apparatus 50 shown in FIG. 1 will be described below. First, the substrate transport mechanism (a transport robot) (not shown) transfers the substrate 4 to the prealignment apparatus 3. The substrate 4 transferred to the prealignment apparatus 3 is prealigned by the prealignment apparatus 3, and transported to the substrate processing stage 1 by the substrate transport mechanism 6. When the substrate 4 has no pattern (i.e., the substrate 4 is not subjected to the lithography process), the exposure process is immediately performed without the high-precision alignment (fine alignment) on the substrate processing stage 1 after the prealignment process performed by the prealignment apparatus 3. This is because the patterns need not be overlaid.

On the other hand, when the pattern has been formed on the substrate 4, the mark detector 2 measures the position of the measurement mark 5 on the substrate 4 in order to measure the position of the pattern of the substrate prealigned by the prealignment apparatus 3. The exposure unit 20 performs the exposure process after the substrate 4 is so aligned as to precisely overlay a pattern to be newly transferred to the existing pattern on the substrate by driving the substrate processing stage 1 on the basis of the measurement result.

Figure 2:
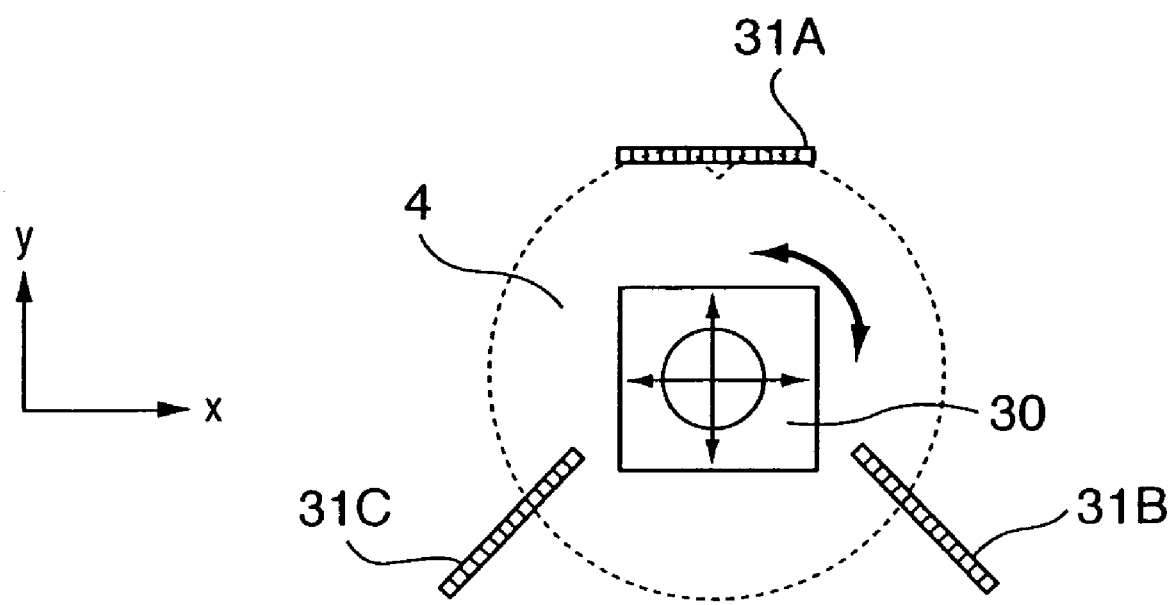
FIG. 2 is a schematic plan view of a prealignment apparatus.
Figure 3:
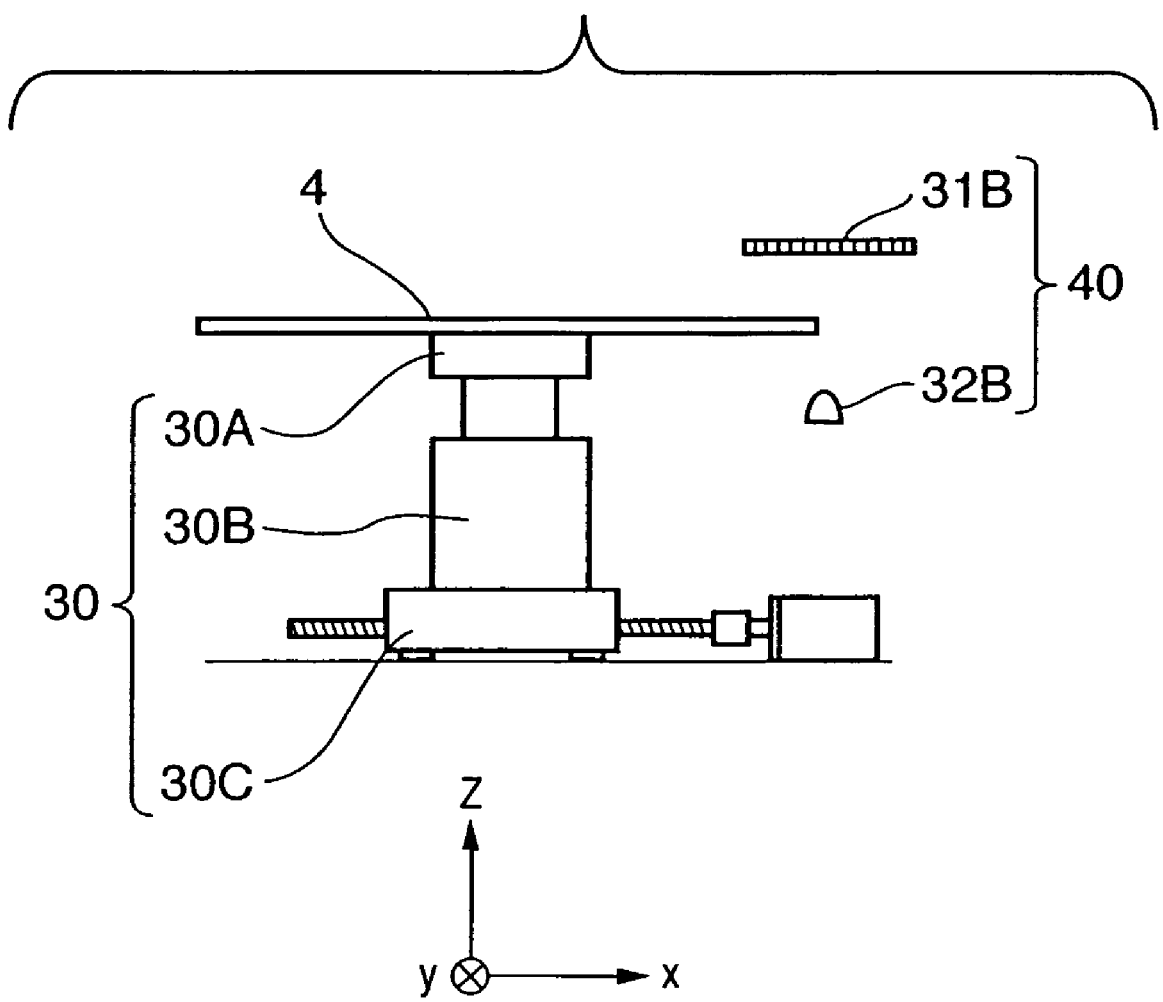
FIG. 3 is a schematic side view of the prealignment apparatus.

An arrangement of the prealignment apparatus 3 will be described next. FIGS. 2 and 3 are a schematic plan view and side view, respectively, showing the prealignment apparatus 3.

The prealignment apparatus 3 has a prealignment stage 30 for driving the substrate in its plane direction (horizontal direction, i.e., X-Y direction and a rotational direction along an axis (rotational direction along a Z-axis, i.e., θ direction). For example, the prealignment stage 30 can include a substrate holding mechanism (substrate chuck) 30A, which chucks and holds the substrate, a rotation mechanism 30B, which rotates the substrate holding mechanism 30A about the Z-axis, and a two-dimensional driving mechanism 30C, which drives the substrate holding mechanism 30A in X and Y directions.

The prealignment apparatus 3 has a peripheral position measurement device 40, which measures the position of the peripheral edge (peripheral portion) of the substrate 4 held on the substrate holding mechanism 30A. The peripheral position measurement device 40 can include three image sensors (e.g., linear image sensors) 31A to 31C and measurement light sources 32A to 32C (only the measurement light source 32B is illustrated), respectively opposing the image sensors 31A to 31C.

Note that, in this embodiment, the substrate 4 has a V-shaped or a U-shaped notch on the peripheral portion on the peripheral portion as a notch indicating the direction. However, the substrate 4 may have a linear notch (orientation flat) on its peripheral portion.

The operation of the prealignment apparatus 3 will be described below with reference to FIGS. 2 and 3. The prealignment apparatus 3 has a function of aligning the substrate 4 with reference to a predetermined portion on the peripheral edge, more specifically, the notch.

First, the substrate transport mechanism (not shown) transports the substrate 4 to the prealignment stage 30. The transported substrate 4 is chucked and held on the substrate holding mechanism 30A, and then the position of the peripheral edge is measured. For example, this measurement process includes processing an output signal from the image sensor 31B every time the substrate 4 rotates by a predetermined angle to obtain data indicating a distance between the rotation center of the substrate rotation angle and the edge of the substrate while the rotation mechanism 30B rotates the substrate 4.

Figure 4:
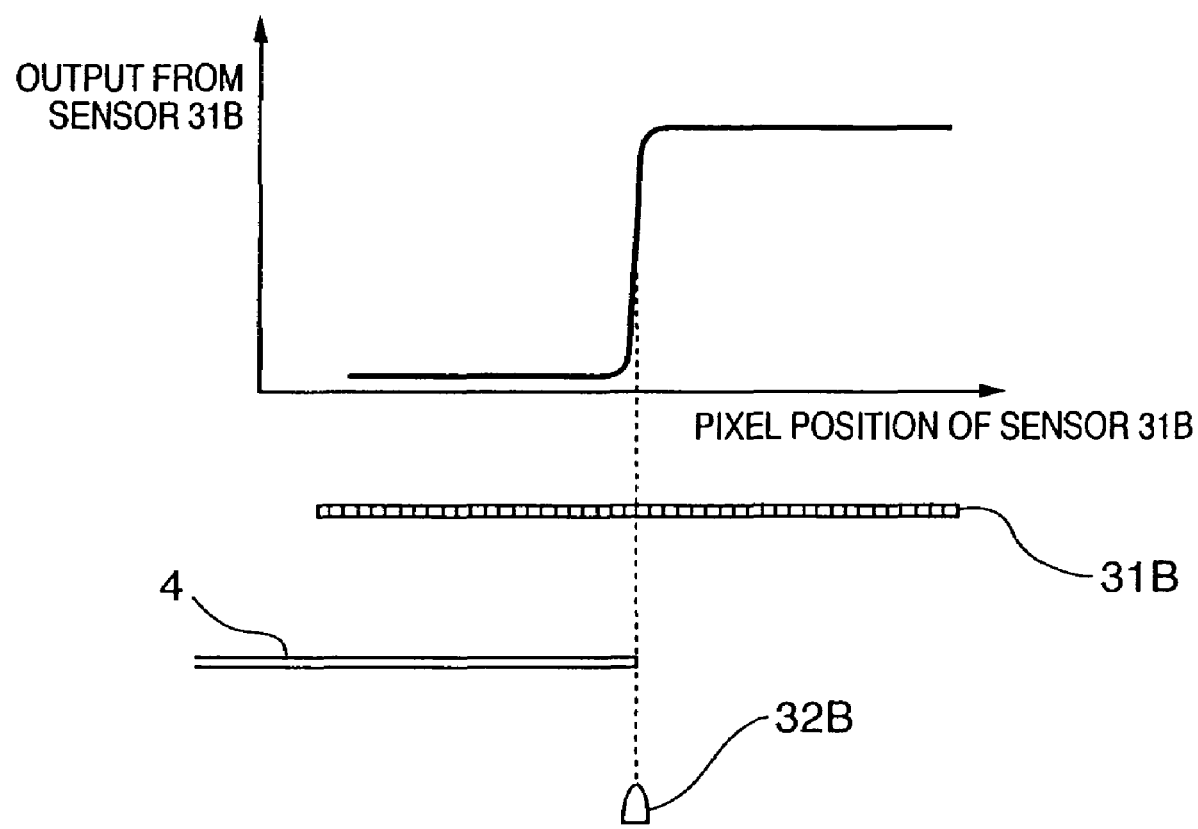
FIG. 4 is a view showing an example of an output from a sensor constituting a substrate peripheral position measurement device.

In the measurement device in which the image sensor 31B and the measurement light source 32B face each other through the substrate, an output signal from the image sensor 31B at an arbitrary angle indicates an exemplary distribution shown in FIG. 4. In a graph shown in FIG. 4, the abscissa indicates a pixel position of the image sensor 31B, and the ordinate indicates each of the pixel values (sensor output values). The output signal value of the image sensor 31B increases as the received light intensity increases. Hence, as shown in FIG. 4, the output value of a portion which is light-shielded by the substrate is small, and that of a portion which is not light-shielded is large. A boundary between the portion with a small output value and that with a large output value indicates the peripheral edge of the substrate 4. Note that the positional relationship between the rotation center of the substrate 4 (substrate holding mechanism 30A) and the image sensor 31B has been known. Hence, the distance between the rotation center and the edge of the substrate can be obtained on the basis of the pixel position of the image sensor 31B on the boundary.

Figure 5:
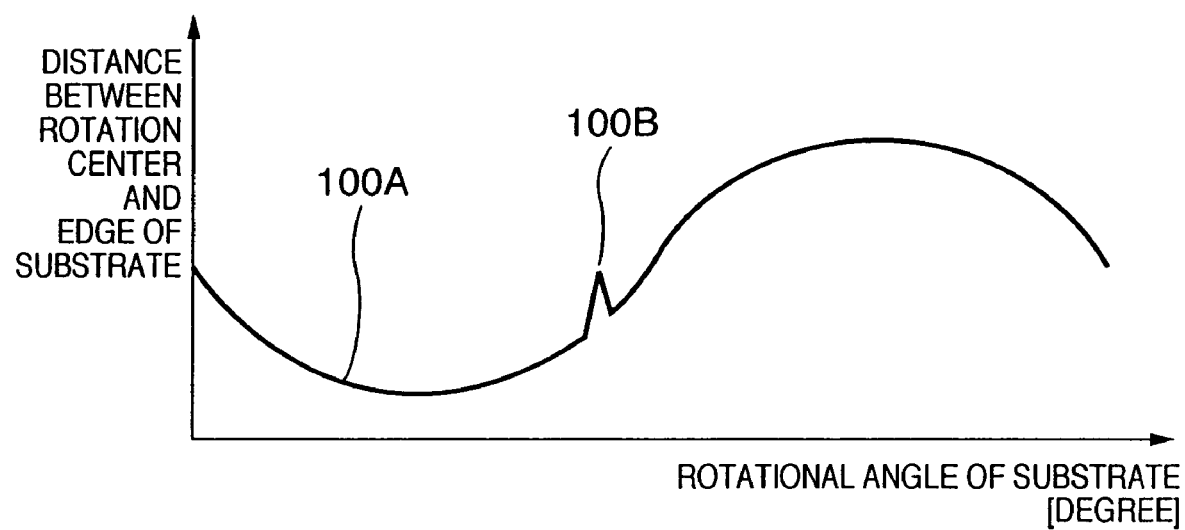
FIG. 5 is a graph showing an example of data obtained by the sensor constituting the substrate peripheral measurement device.

Throughout the entire circumference of the substrate, this measurement process is executed every time the substrate rotates by a predetermined angle, so that the exemplary data shown in FIG. 5 can be obtained. In FIG. 5, the abscissa indicates the rotation angle of the substrate, and the ordinate indicates the distance between the rotation center and the edge of the substrate (peripheral edge of the substrate), which is obtained on the basis of the output from the image sensor 31B. In FIG. 5, a sharp change point 100B on the graph indicates the notch on the substrate 4.

On the basis of the sharp change point 100B on the data (graph) shown in FIG. 5, an angle or a direction (Δθ) of the notch can be obtained. On the basis of the amplitude of a curve 100A, a decentering amount (ΔXY) of the center of the substrate 4 for the rotation center of the substrate holding mechanism 30A can be calculated. Note that detection of AO and ΔXY indicates the detection of the notch and center of the substrate.

On the basis of the values Δθ and ΔXY obtained as described above, the rotation mechanism 30B and the two-dimensional driving mechanism 30C rotate (in the θ direction) and horizontally move (in the X-Y direction) the substrate holding mechanism 30A. Hence, the notch on the substrate 4 is set in a predetermined direction, and the center of the substrate 4 is roughly aligned to a predetermined target position (e.g., the origin of the prealignment stage 30) (process 1).

Then, the substrate holding mechanism 30A is rotated (in the θ direction) and horizontally moved (in the X-Y direction) such that the outputs from the three image sensors 31A to 31C become predetermined outputs, thereby completing the final prealignment process of the substrate 4 in the case that the notch on the substrate 4 is used as the alignment reference (process 2). In this final prealignment process, for example, the substrate holding mechanism 30A is driven such that the notch opposes the predetermined position of the image sensor 31A, and the light-shielding amounts of the image sensors 31B and 31C by the substrate 4 become equal to each other.

In the above prealignment process, the notch of the substrate 4 is aligned to the predetermined position (including the position in the rotational direction (angle)) when the process 2 is completed.

As described above, the prealigned substrate 4 is transported to the substrate processing stage 1 by the substrate transport mechanism 6, and then more precisely aligned and exposed.

Assume that the underlying pattern has been formed on the substrate 4. When the prealignment process has been performed using the center of the substrate as the alignment reference in forming the underlying pattern, the mark may fall outside the field of view even when the mark on the substrate 4 placed on the substrate processing stage 1 is to be observed by the mark detector 2.

This is because, while the substrate aligned by the prealignment apparatus, which aligns the substrate with reference to the center of the substrate, is placed on the substrate processing stage 1 so as to match the center of the substrate to the center of the substrate processing stage 1, the substrate aligned by the prealignment apparatus, which aligns the substrate with reference to the peripheral edge of the substrate, is not always placed on the substrate processing stage 1 so as to match the center of the substrate to the center of the substrate processing stage 1.

More specifically, for example, when the prealignment apparatus, which aligns the substrate with the radius R with reference to the peripheral edge portion of the substrate, prealigns the substrate with the radius R+$\Delta$r, the central position of the substrate placed on the substrate processing stage 1 is shifted by $\alpha \times \Delta r$ because of the manufacturing error of the radius of the substrate. Note that reference symbol $\Delta r$ indicates the manufacturing error of the radius of the substrate; and $\alpha$, a constant depending on the attachment position, and the like, of the prealignment apparatus using the peripheral edge of the substrate as the alignment process.

Figure 6:
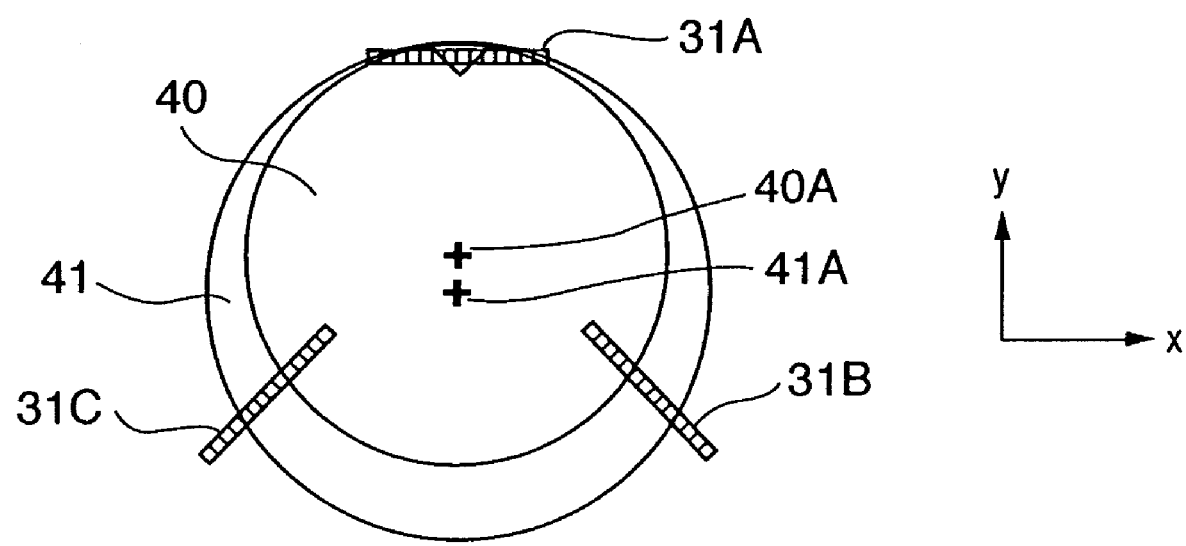
FIG. 6 is a view showing a positional relationship between the substrates with different sizes when aligning them.

For example, as shown in FIG. 6, assume that the substrates 40 and 41 with different sizes are aligned with reference to the respective peripheral edges. In this case, at the time of completing the above prealignment process (at the time of completing "process 2"), the centers of 40A and 41A of the respective substrates 40 and 41 do not match each other. This is because the substrate holding mechanism 30A is driven such that the notch opposes the predetermined position of the image sensor 31A, and that the light-shielding amounts of the image sensors 31B and 31C by the substrate 4 are equal in the process 2.

Therefore, in the substrate processing apparatus having the prealignment apparatus for aligning the substrate with reference to the peripheral edge of the substrate, when each of the substrates 40 and 41 is placed on the substrate processing stage 1, the central positions of the two substrate 40 and 41 are shifted by the distance between the centers 40 and 41 are shifted by the 40A and 41A in FIG. 6. On the other hand, in the substrate processing apparatus having the prealignment apparatus for aligning the substrate with reference to the center of the substrate, the central positions of the substrates 40 and 41 on the substrate processing stage match each other.

That is, the positions of the substrates aligned by the prealignment apparatuses with different alignment references are different from each other on the substrate processing stage. This indicates that a resultant prealignment error occurs in the state wherein the substrate is placed on the substrate processing stage. When the prealignment error is large, the mark on the substrate falls outside the field of view in observing the mark by the mark detector 2. In this case, typically, the operation of the substrate processing apparatus 50 stops.

Therefore, in this embodiment, the storage unit (setting unit) 8 stores (sets) information indicating the alignment reference of the target substrate (to be referred to as alignment reference information or reference information) in advance. Then, the controller 7 switches the prealignment operation of the prealignment apparatus 3 in accordance with the reference information set in the storage unit 8. The alignment reference information may be manually or automatically set by obtaining the information from control information such as an exposure job and recipe file by the controller 7.

In this embodiment, the alignment reference set in the storage unit 8 may be:

(1) the peripheral edge of the substrate, and
(2) the center of the substrate.

Note that any position different from these may be used as the alignment reference.

The prealignment operation executed by the prealignment apparatus 3 can be switched as follows.

When the storage unit 8 sets the "peripheral edge of substrate" as the alignment reference, the above prealignment processes 1 and 2 are executed, and then the substrate transport mechanism 6 transports the substrate to the substrate processing stage 1.

On the other hand, when the storage unit 8 sets the "center of the substrate" as the alignment reference, only the above prealignment process 1 is executed, and then the substrate transport mechanism 6 transports the substrate to the substrate processing stage 1.

As described above, in the preferred embodiment of the present invention, regardless of which portion in the target substrate with the underlying pattern is used as the alignment reference in the prealignment process for forming the underlying pattern, the prealignment process is executed with reference to the alignment reference for forming a new pattern. Hence, the problem, in which the mark falls outside the field of view of the mark detector 2 because the alignment references used in the prealignment process are different in the continuous lithography processes, can be solved. As a result, there is no need for the manual assist and mark search, thereby preventing the decrease in throughput of the substrate processing apparatus.

Modifications of the above embodiment will be described below.

(Modification 1)

In the above prealignment process 1, on the basis of the relationship between the substrate rotational angle and the distance between the rotation center and the edge of the substrate, not only the positional information such as the decentering amount ($\Delta XY$) and orientation ($\Delta \theta$) of the substrate, but also the size of the substrate (radius of the substrate) and the size of the notch are calculated. In accordance with the alignment reference set in the storage unit 8, the driving method may be switched.

More specifically, when the notch of the substrate is used as the alignment reference, on the basis of the positional information of the substrate and the size information of the substrate and notch, the driving amount in the X-Y and $\theta$ directions (alignment target position) in the prealignment process 1 is set so that the notch can be aligned at the target position. On the other hand, when the center of the substrate is used as the alignment reference, the alignment process as in the above prealignment process 1 can be performed.

In this modification, regardless of the setting of the alignment reference, the process 2 is not required. The semiconductor processing apparatus may having only one prealignment measurement sensor.

(Modification 2)

In the above prealignment process 1, on the basis of the relationship between the substrate rotational angle and the distance between the rotation center and the edge of the substrate, not only the positional information such as the decentering amount ($\Delta XY$) and orientation ($\Delta \theta$) of the substrate, but also the manufacturing error ($\Delta r$) of the size of the substrate (radius of the substrate) and the manufacturing error of the size of the notch are calculated.

When the center of the substrate is used as the alignment reference, during or after the prealignment process 2, the substrate is driven in the X-Y direction by the manufacturing error ($\Delta r$) of the size of the substrate (radius of the substrate) and the manufacturing error of the size of the notch calculated in the process 1 so as to align the center of the substrate to the target position. On the other hand, when the notch of the substrate is used as the alignment reference, the alignment process as in the above prealignment process 2 can be performed.

Note that as a method of driving the substrate by the manufacturing errors in the X and Y directions, for example, there are a method of driving the substrate holding mechanism 30A on the basis of the manufacturing errors, and a method of driving the substrate holding mechanism 30A such that the light-shielding amounts of the image sensors 31B and 31C by the substrate 4 become equal to the correction amount of the manufacturing error.

(Modification 3)

When driving the substrate in the X, Y and $\theta$ directions in the above prealignment process 2, the driving amount in the X-Y direction can be changed to the driving amount in the X and Y directions obtained in the process 1 (the driving amount for matching the center of the substrate to the target position (e.g., the origin of the prealignment stage 30)). When the center of the substrate is used as the alignment reference in accordance with the alignment reference set in the storage unit 8, the driving amounts in the X and Y directions may be changed.

Note that the number of sensors required for the prealignment in the modifications 2 and 3 is larger than that in the modification 1. However, in the modifications 2 and 3, the substrate is aligned in the rotational direction ($\theta$ direction) such that the position of the notch opposes the predetermined position of the sensor 31A. Hence, the alignment precision (defined by the measurement resolution of the peripheral position measurement device 40 and the driving resolution of the prealignment stage 30) is easily improved.

On the other hand, in order to improve the alignment precision of the substrate in the rotational direction ($\theta$ direction), the number of samples for obtaining the data shown in FIG. 5 needs to be increased, and the position of the notch in the rotational direction ($\theta$ direction) needs to be precisely obtained. When the number of samples is increased, the measurement time becomes long, and the throughputs of the prealignment apparatus and the substrate processing apparatus decrease.

(Modification 4)

The prealignment measurement system is so arranged as to measure the substrate on three or more points on the peripheral edge. The measurement system, which is used in aligning the substrate in the horizontal direction (X and Y directions), is switched in accordance with the alignment reference set in the storage unit 8. Hence, the target position for aligning the substrate in the X-Y direction may be switched.

For example, one measurement system shown in FIG. 4 (to be referred to as a measurement system constituted by a sensor 31D and a measurement light source 32D) is added to the prealignment measurement system shown in FIG. 2. When the substrate is aligned with reference to the peripheral edge, as described above, the three measurement systems 31A to 31C are used for the alignment process (e.g., the two measurement systems 31B and 31C align the substrate in the X direction, and one measurement system 31A aligns the substrate in the Y and $\theta$ directions). When the substrate is aligned with reference to the center of the substrate, four measurement systems 31A to 31D are used (e.g., the two measurement systems 31B and 31C align the substrate in the X direction, the two measurement systems 31B and 31D align the substrate in the Y direction, and one measurement system 31A aligns the substrate in the $\theta$ direction).

By employing these arrangements, the alignment target position in the X and Y directions is switched in accordance with the alignment reference set in the storage unit 8.

(Modification 6)

By using the size information of the substrate (the radius of the substrate), which is obtained by the measurement result of the prealignment measurement system, the substrate transfer position in at least one of the substrate transfer mechanism 6 and the substrate processing stage 1 may be switched by the manufacturing error ($\Delta r$ or the like) of the substrate in accordance with the alignment reference set in the storage unit 8.

(Modification 7)

After the substrate is prealigned in the above processes 1 and 2, the substrate is placed on the substrate processing stage 1. When the center of the substrate is used as the alignment reference set in the storage unit 8, the substrate processing stage 1 is moved by the manufacturing error ($\Delta r$) of the substrate in detecting the mark by the mark detector 2 on the basis of the size of the substrate (the radius of the substrate), which is obtained by the measurement result of the prealignment measurement system such that the mark falls within the field of view of the mark detector 2.

(Modification 8)

In order to obtain the size of the substrate, another measurement system may be added to the above prealignment measurement system.

Figure 7:
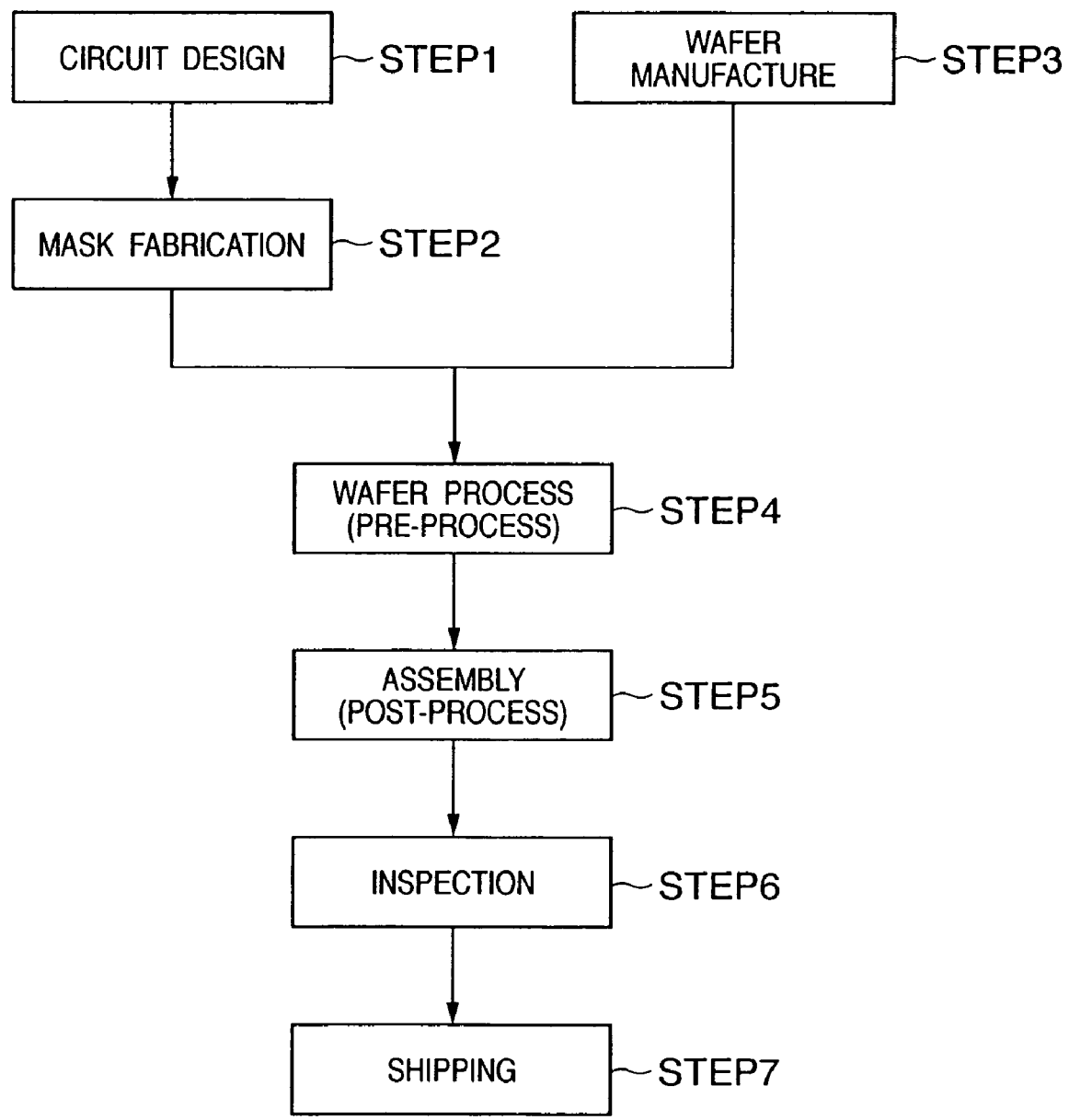
FIG. 7 is a flow chart showing a device manufacturing method using the substrate processing apparatus or exposure apparatus of the present invention.

An embodiment of a device manufacturing method using the above-described substrate processing apparatus or exposure apparatus will be described next. FIG. 7 shows the flow of manufacturing a microdevice (e.g., a semiconductor chip such as an IC or an LSI, a liquid crystal panel, a CCD, a thin-film magnetic head, or a micromachine). In step 1 (circuit design), the pattern of a device is designed. In step 2 (mask preparation), a mask having the designed pattern is prepared. In step 3 (wafer manufacture), a wafer is manufactured using a material such as silicon or glass. In step 4 (wafer process), called a preprocess, an actual circuit is formed on the wafer by lithography using the prepared mask and wafer. In step 5 (assembly), called a post-process, a semiconductor chip is formed from the wafer prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and delivered (step 7).

Figure 8:
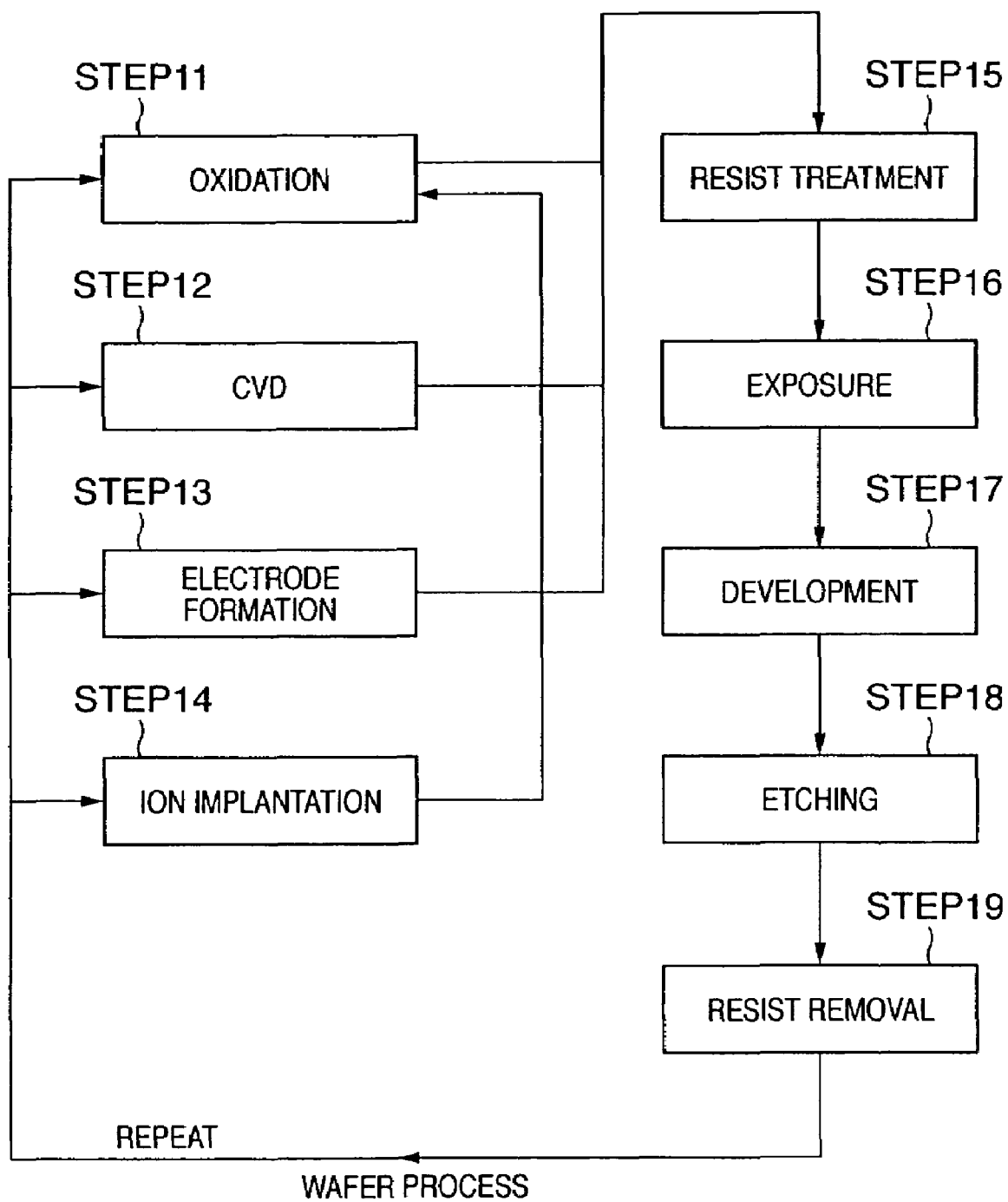
FIG. 8 is a flow chart showing details of the wafer process shown in FIG. 7.

FIG. 8 shows the detailed flow of the wafer process (step 4). In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a resist is applied to the wafer. In step 16 (exposure), the circuit pattern of the mask is transferred on the wafer by exposure using the above-described substrate processing apparatus or exposure apparatus. In step 17 (development), the exposed wafer is developed. In step 18 (etching), portions other than the developed resist image are etched. I step 19 (resist peeling), the unnecessary resist remaining after etching is removed. By repeating these steps, a multilayered structure of circuit patterns is formed on the wafer.

As many apparently widely different embodiments of the present invention can be made without departing form the spirit and scope thereof, it is to be understood that the invention is not limited to the specific embodiments thereof except as defined in the claims.

What is claimed is:

1. A positioning apparatus for positioning a substrate, said apparatus comprising:
   a positioning system which measures an edge of the substrate while rotating the substrate and positions the substrate with a result of the measurement based on a position of a reference; and
   a controller which switches an operation of said positioning system to one of a first mode and a second mode, wherein said positioning system positions the substrate using a center of the substrate for the reference in the first mode, and positions the substrate using a notch of the substrate for the reference in the second mode.

2. The apparatus according to claim 1, wherein said controller switches the operation of said positioning system according to information inputted to said positioning apparatus.

3. The apparatus according to claim 1, wherein said positioning system includes a plurality of image sensors, and said positioning system measures the edge of the substrate using one of the plurality of image sensors and positions the substrate using the plurality of image sensors.

4. The apparatus according to claim 1, further comprising a substrate transfer system which transfers the substrate positioned by said positioning system using the center of the substrate for the reference in the first mode and is transferred to a substrate stage by said substrate transfer system, and the substrate is positioned by said positioning system using the notch of the substrate for the reference in the second mode and is transferred to the substrate stage by said substrate transfer system.

5. A substrate processing apparatus for processing a substrate, said apparatus comprising:
   a substrate stage which holds the substrate; and
   a prealignment system which prealigns the substrate before the substrate is held by said substrate stage,
   said prealignment system including a positioning system which measures an edge of the substrate while rotating the substrate and positions the substrate with a result of the measurement based on a position of a reference, and a controller which switches an operation of said positioning system to one of a first mode and a second mode, wherein said positioning system positions the substrate using a center of the substrate for the reference in the first mode, and positions the substrate using a notch of the substrate for the reference in the second mode.

6. The apparatus according to claim 5, further comprising:
   a substrate transfer system which transfer the substrate prealigned by said prealignment system to said substrate stage; and
   a mark measurement system which measures the substrate held by said substrate stage.

7. An exposure apparatus for exposing a substrate, said apparatus comprising:
   a positioning system which measures an edge of the substrate while rotating the substrate and positions the substrate with a result of the measurement based on a position of a reference; and
   a controller which switches an operation of said positioning system to one of a first mode and a second mode, wherein said positioning system positions the substrate using a center of the substrate for the reference in the first mode, and positions the substrate using a notch of the substrate for the reference in the second mode.

8. The apparatus according to claim 7, further comprising a substrate transfer system which transfers the substrate positioned by said positioning system, wherein the substrate is positioned by said positioning system using the center of the substrate for the reference in the first mode and is transferred to a substrate stage by said substrate transfer system, and the substrate is positioned by said positioning system using the notch of the substrate for the reference in the second mode and is transferred to the substrate stage by said substrate transfer system.

9. A positioning apparatus for positioning a substrate, said apparatus comprising:
   a positioning system which measures an edge of the substrate while rotating the substrate and positions the substrate with a result of the measurement based on a position of a reference; and
   a controller which switches an operation of said positioning system to one of a first mode and a second mode, wherein said positioning system positions the substrate using a center of the substrate for the reference in the first mode, and positions the substrate using an orientation flat of the substrate for the reference in the second mode.

10. The apparatus according to claim 9, further comprising a substrate transfer system which transfers the substrate positioned by said positioning system, wherein the substrate is positioned by said positioning system using the center of the substrate for the reference in the first mode and is transferred to a substrate stage by said substrate transfer system, and the substrate is positioned by said positioning system using the orientation flat of the substrate for the reference in the second mode and is transferred to the substrate stage by said substrate transfer system.

11. A substrate processing apparatus for processing a substrate, said apparatus comprising:
   a substrate stage which holds the substrate; and
   a prealignment system which prealigns the substrate before the substrate is held by said substrate stage,
   said prealignment system including a positioning system which measures an edge of the substrate while rotating the substrate and positions the substrate with a result of the measurement based on a position of a reference, and a controller which switches an operation of said positioning system to one of a first mode and a second mode, wherein said positioning system positions the substrate using a center of the substrate for the reference in the first mode, and positions the substrate using an orientation flat of the substrate for the reference in the second mode.

12. The apparatus according to claim 11, further comprising:
   a substrate transfer system which transfers the substrate prealigned by said prealignment system to said substrate stage; and
   a mark measurement system which measures the substrate held by said substrate stage.

13. An exposure apparatus for exposing a substrate, said apparatus comprising:
   a positioning system which measures an edge of the substrate while rotating the substrate and positions the substrate with a result of the measurement based on a position of a reference; and
   a controller which switches an operation of said positioning system to one of a first mode and a second mode, wherein said positioning system positions the substrate using a center of the substrate for the reference in the first mode, and positions the substrate using an orientation flat of the substrate for the reference in the second mode.

14. The apparatus according to claim 13, further comprising a substrate transfer system which transfers the substrate positioned by said positioning system, wherein the substrate is positioned by said positioning system using the center of the substrate for the reference in the first mode and is transferred to a substrate stage by said substrate transfer system, and the substrate is positioned by said positioning system using the orientation flat of the substrate for the reference in the second mode and is transferred to the substrate stage by said substrate transfer system.

* * * * *